United States Patent [19]

Yang

[11] Patent Number: 5,395,777
[45] Date of Patent: Mar. 7, 1995

[54] METHOD OF PRODUCING VDMOS TRANSISTORS

[75] Inventor: Sheng-Hsing Yang, Hsinchu, Taiwan, Prov. of China

[73] Assignee: United Microelectronics Corp., Hsinchu, Taiwan, Prov. of China

[21] Appl. No.: 223,596

[22] Filed: Apr. 6, 1994

[51] Int. Cl.$^6$ .......................................... H01L 21/336
[52] U.S. Cl. ............................... 437/40; 437/41; 437/203
[58] Field of Search .............. 437/29, 40, 41, 203; 257/244, 621, 902; 156/644

[56] References Cited

U.S. PATENT DOCUMENTS

| | | | |
|---|---|---|---|
| 4,503,598 | 3/1985 | Vora et al. | 437/41 |
| 4,625,388 | 2/1986 | Rice | 437/29 |
| 4,682,405 | 7/1987 | Blanchard et al. | 437/15 |
| 4,748,103 | 5/1931 | Hollinger | 437/229 |
| 4,860,084 | 8/1989 | Shibata | 257/621 |
| 4,960,723 | 10/1990 | Davies | 437/41 |
| 5,089,434 | 2/1992 | Hollinger | 437/40 |

*Primary Examiner*—Tom Thomas
*Attorney, Agent, or Firm*—Ladas & Parry

[57] ABSTRACT

A method of producing reduced-size VDMOS transistors having reduced leakage and a reduced propensity to latch-up. These advantages are attained by reducing the vertical projective area of the source electrodes of the VDMOS transistors. This is done by forming first trenches which are sufficiently deep to reach an epitaxial layer on a substrate of the VDMOS transistors before second trenches are formed.

7 Claims, 9 Drawing Sheets

METHOD OF PRODUCING VDMOS TRANSISTORS

FIELD OF THE INVENTION

The present invention relates to a method of producing VDMOS (Vertical Diffused Metal Oxide semiconductor) transistors, especially to a method of producing VDMOS transistors having reduced dimensions, reduced leakage, and reduced propensity to latch-up.

BACKGROUND OF THE INVENTION

Figure 1:
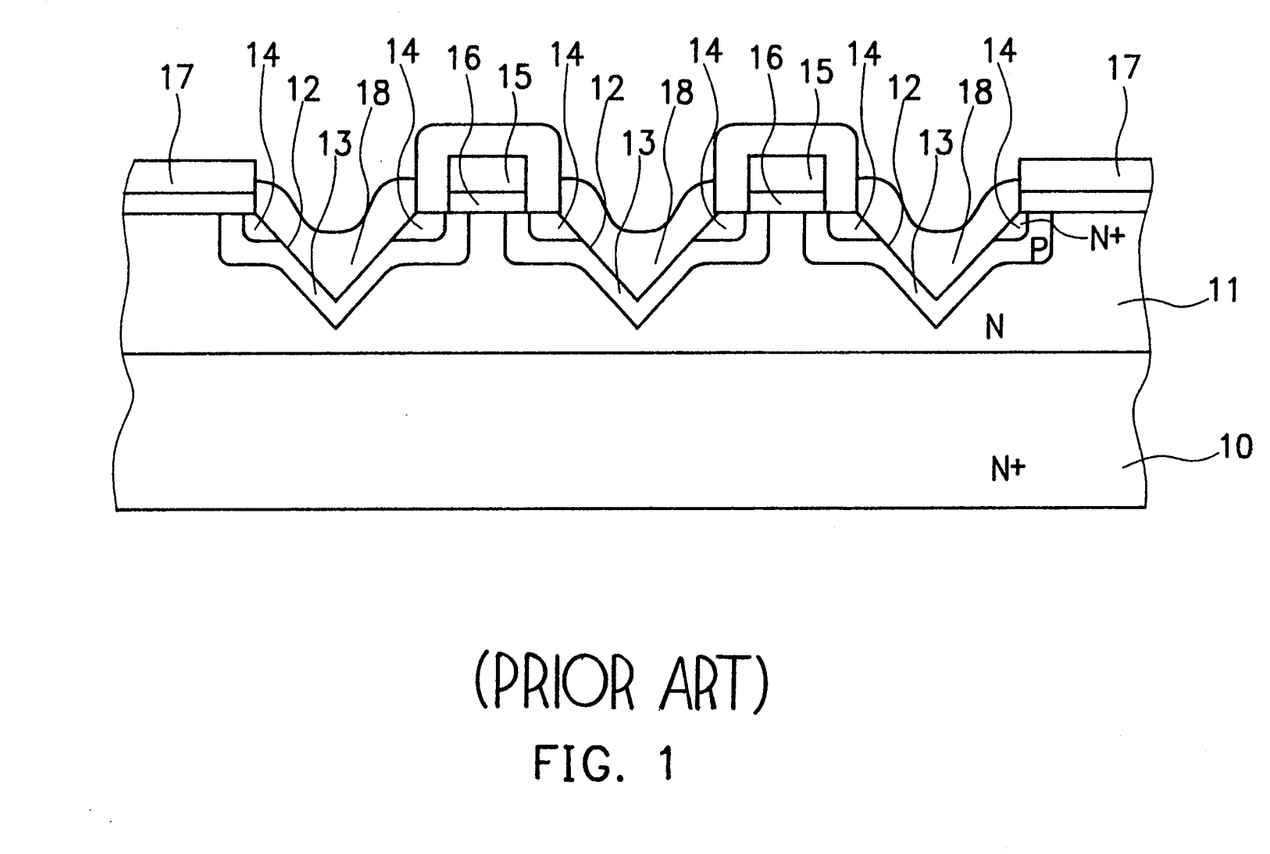
FIG. 1 shows a cross-sectional view of the structure of VDMOS transistors disclosed in U.S. Pat. No. 4,682,405.

A cross-sectional view of the structure of VDMOS transistors disclosed in U.S. Pat. No. 4,682,405 is shown in FIG. 1. The VDMOS transistors have an N+ substrate 10, which forms the drain electrode of the transistors, an N type epitaxial layer 11, a V-shaped trench 12, a P type body region 13, an N+ source region 14, a gate electrode 15, gate oxide 16, an oxide layer 17, and a source electrode metal contact 18. In this structure, the V-shaped trench 12 is used to reduce the dimension of the entire VDMOS transistor. However, the N+ source region 14, the P type body region 13, and the N+ substrate 10 form a vertical parasitic NPN transistor, and since the vertically projected area of the N+ source region 14 is relatively large, the leakage caused by the parasitic NPN transistor and the propensity to latch-up are relatively large.

SUMMARY OF THE INVENTION

The object of the present invention is to provide a method of producing VDMOS transistors which has reduced dimensions, reduced leakage, and a reduced propensity to latch-up.

The above objects are fulfilled by providing a method of forming VDMOS transistors on a substrate of a first conductivity type having a first conductivity type epitaxial layer, said substrate forming a drain electrode of the VDMOS transistors. The method comprises the following steps: (a) forming field oxides on said first conductivity type epitaxial layer to define active regions of said VDMOS transistors; (b) forming gate electrodes of said VDMOS transistors at predetermined positions of the active regions; (c) implanting and diffusing impurities of the first conductivity type into said first type epitaxial layer to form first conductivity type regions; (d) forming trenches on the first conductivity type regions which are sufficiently deep to reach the first conductivity type epitaxial layer and to define residual portions of the first conductivity type regions as the source electrodes of the VDMOS transistors; (e) forming second trenches on the first trenches, each of the second trenches having at least two planes; (f) implanting and diffusing impurities of a second conductivity type into the second trenches to form second conductivity type regions, the second conductivity type body regions enclosing the source electrodes; and (g) metalizing said substrate.

BRIEF DESCRIPTION OF THE DRAWING

The present invention be more fully understood from the following detailed description when read with reference to the accompanying drawings, which are illustrative of preferred embodiments of the invention only, and thus are not limitative of the present invention and wherein.

DETAILED DESCRIPTION OF THE PREFERRED EMBODIMENTS

One of the preferred embodiments of the present invention is shown in FIGS. 2a to 2g. In this embodiment, an N+ substrate 20 having an N type epitaxial layer 200 is used to form VDMOS transistors. In the second embodiment, an P+ substrate 20 having an P type epitaxial layer 200 is used to form VDMOS transistors, which are made in a similar process with appropriate conductivity type changes to the various regions which are implanted. The processing of the N+ substrate is described in detail below, while the processing of the P+ substrate will be readily apparent to those skilled in the art from the detailed description given for the N+ substrate.

STEP 1

Field oxide regions 21 are formed on the N type epitaxial layer 200 to define an active region 22 of the VDMOS transistors. The active regions may be defined, for example, by forming an oxide layer by thermal oxidization, and then etching the oxide layer using conventional lithography techniques; or, by forming a pad oxide and a silicon nitride layer, and then etching by conventional lithography techniques, to form the field oxide regions 21 shown in FIG. 2a.

STEP 2

Figure 2A:
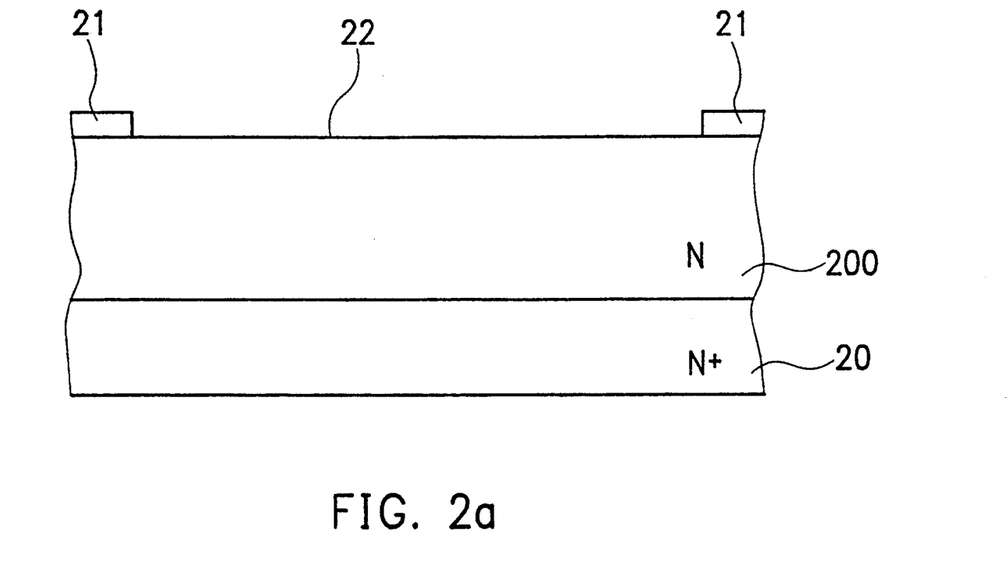
FIGS. 2a to 2g depict various steps in producing VDMOS transistors according to a first embodiment of the method of the present invention.
Figure 2B:
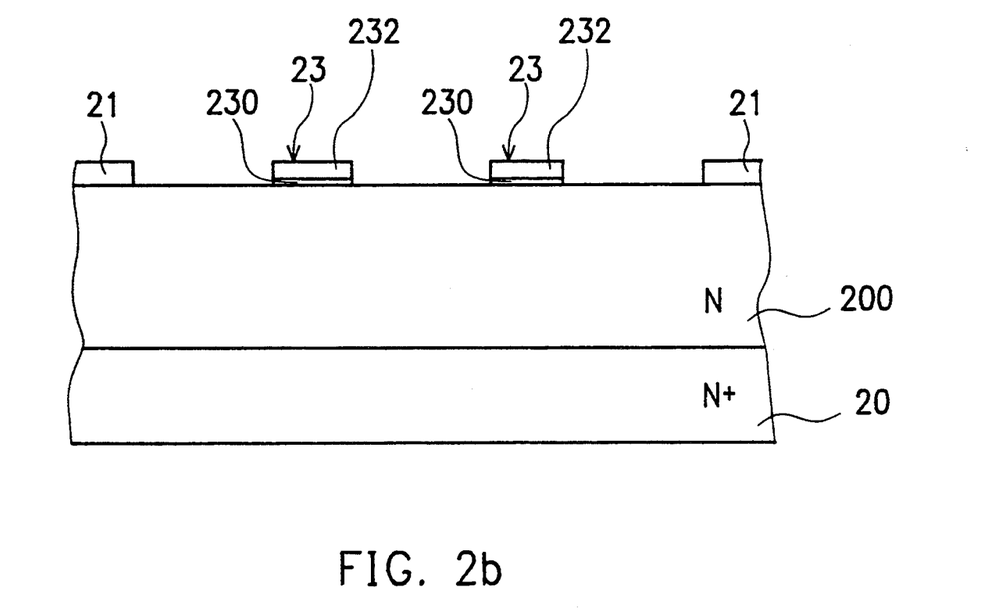

As shown in FIG. 2b, gate electrodes 23 are formed on predetermined regions of the active region 22. This can be done, for example, by forming a gate oxide layer 230, depositing a polysilicon layer 232 on the gate oxide layer 230, and etching the gate oxide 230 and the polysilicon layer 232 using conventional lithography techniques to form the gate electrodes shown in the figure.

STEP 3

Figure 2C:
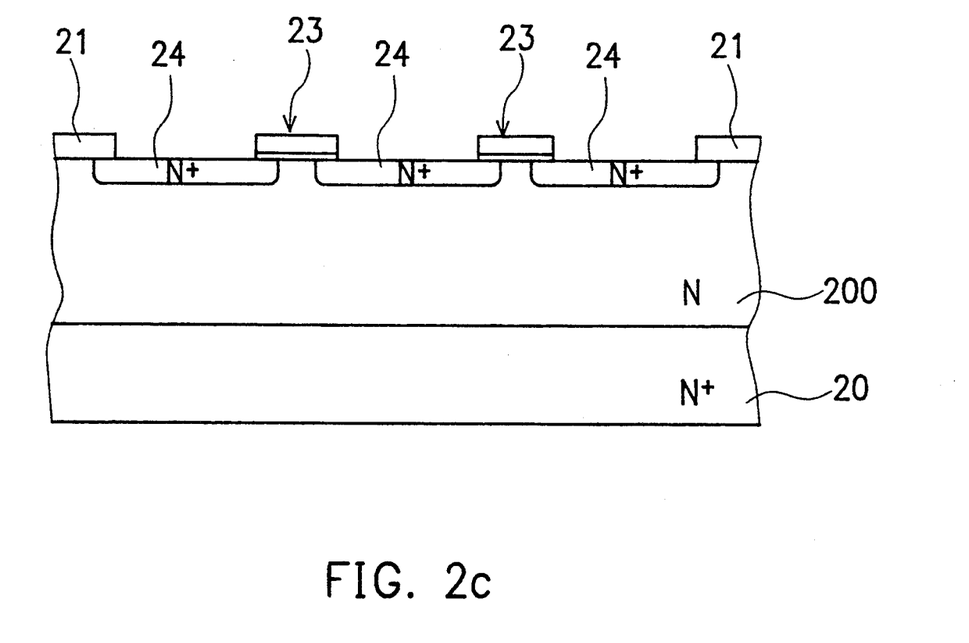

As shown in FIG. 2c, N type impurities are implanted into the N type epitaxial layer 200 and diffused, to form N+ regions 24. This can be done using conventional implantation and diffusion techniques.

STEP 4

Figure 2D:
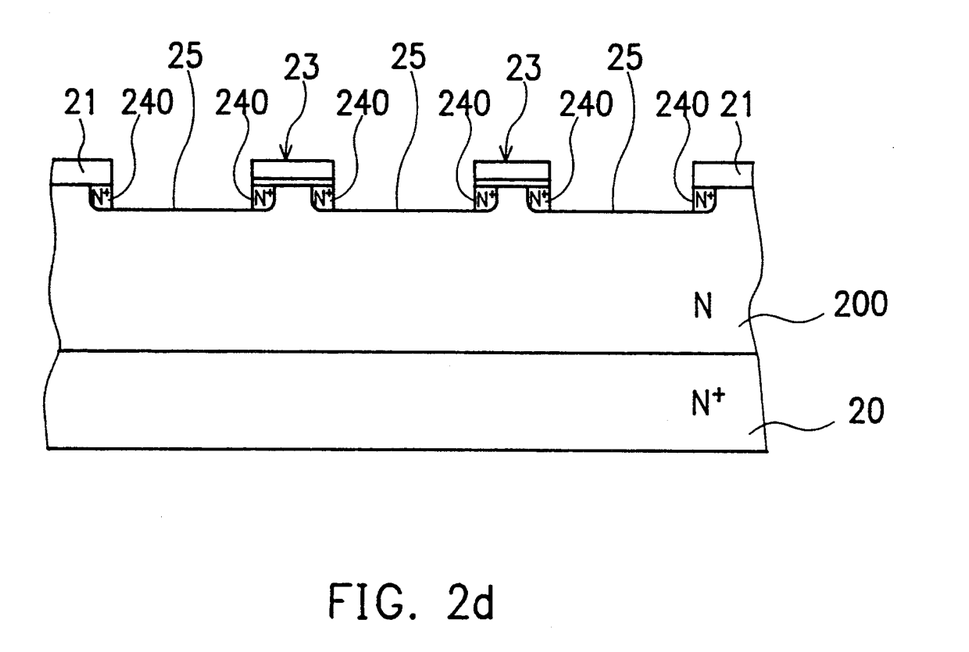

As shown in FIG. 2d, trenches 25 are formed in the N+ regions 24. The boundaries of the trenches 25 are the same as that of the field oxides 21 and the gate electrodes 23. The bottom of the trenches 25 are sufficiently deep to reach the N type epitaxial layer 200 below the N+ regions 24. The residual portions of the N+ regions 24 form source electrodes 240 of the VDMOS transistors. The etching can be done by conventional anisotropic etching techniques, e.g. Reactive Ion Etching (RIE) using the field oxides 21 and the gate electrodes 23, for example, as a mask.

STEP 5

Figure 2E:
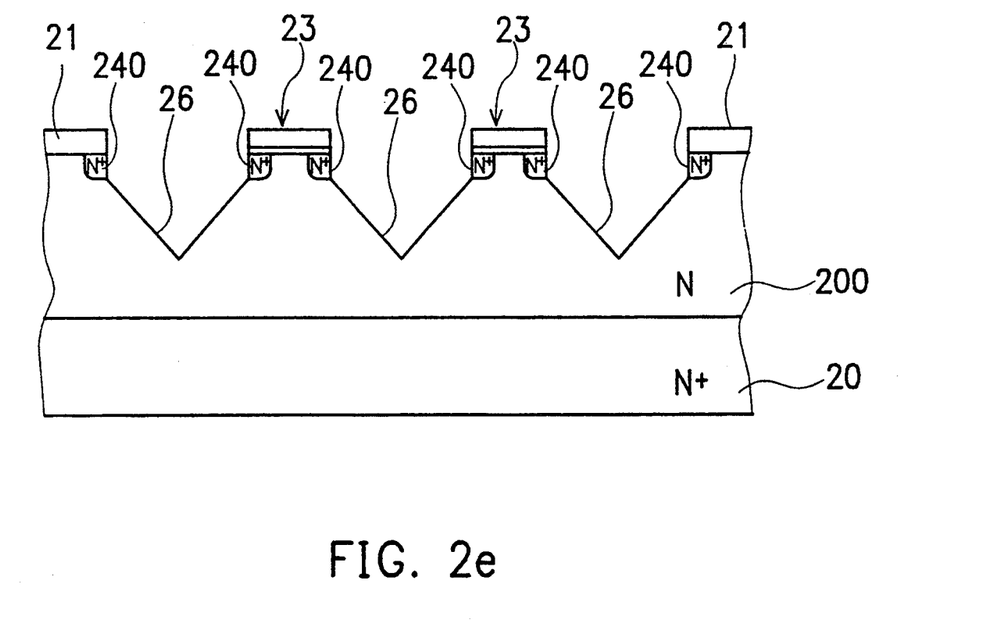

As shown in FIG. 2e, additional trenches 26 are formed on the first-mentioned trenches 25. Each of the second-mentioned trenches 26 consists of at least two side walls. The shape of the second-mentioned trenches 26 are preferably V-shaped, as shown in FIG. 2e, but other shapes may be utilized, if desired. If the second trenches 26 are V-shaped, this step can be done by conventional anisotropic etching techniques, e.g. etching the second-mentioned trenches 26 using an etchant provided by a solution containing KOH and isopropyl alcohol. Also, those skilled in the art will appreciate that the silicon layer 200 should have a (100)-plane at its top surface because KOH solutions preferentially etch the (100)-plane over the (111)-plane. The (111)-plane resists the etch and thus the side walls of the trench 26 are defined by (111)-planes.

STEP 6

Figure 2F:
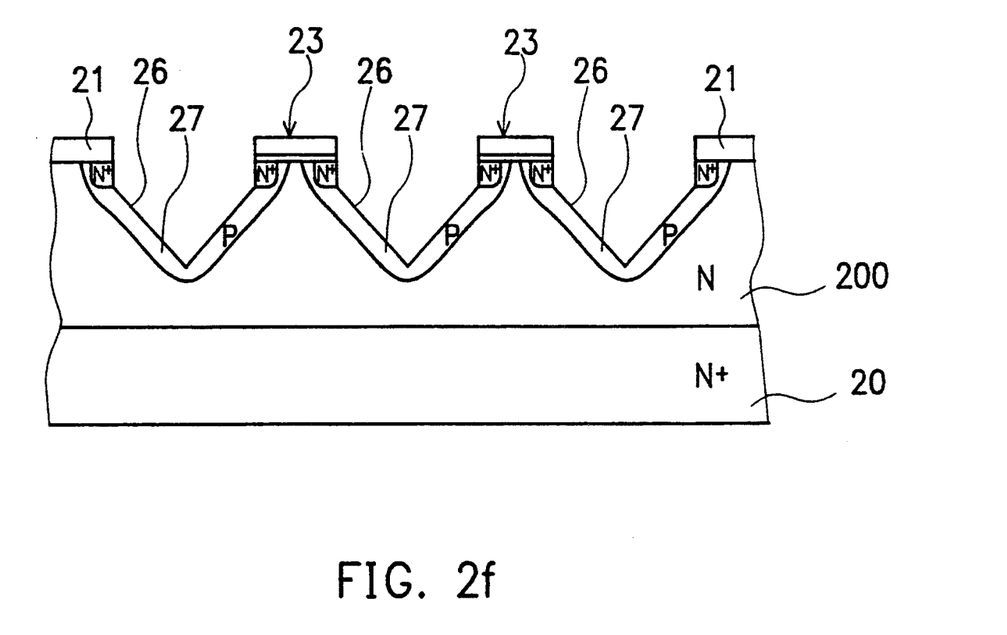

As shown in FIG. 2f, P type impurities are implanted into the second-mentioned trenches 26 and diffused to form P type body regions 27. This can be done using conventional implantation and diffusion techniques. It should be noted that the dosage of the P type impurities must not be so high as to change the conductivity type of N+ source electrodes 240.

STEP 7

Figure 2G:
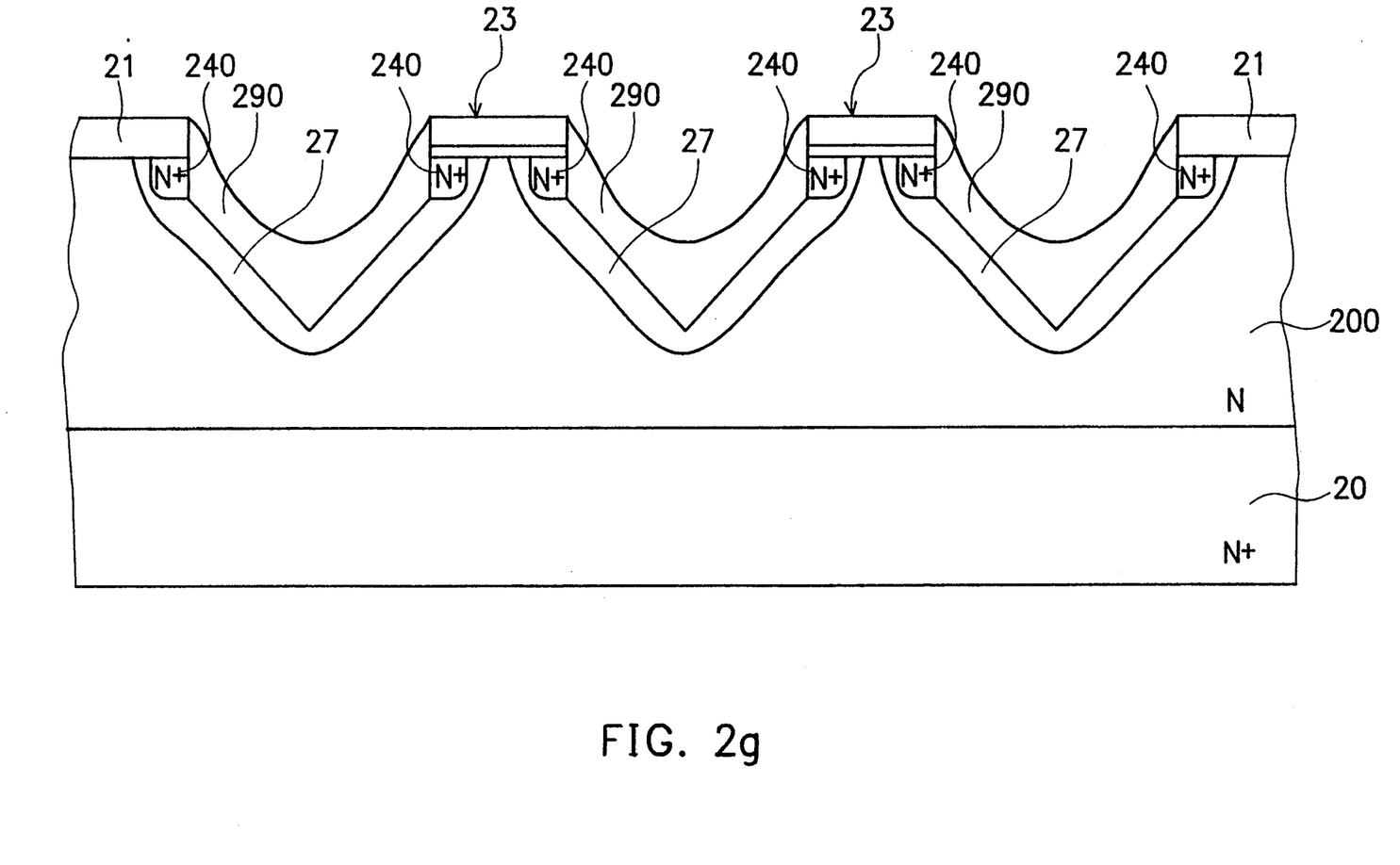
Figure 3A:
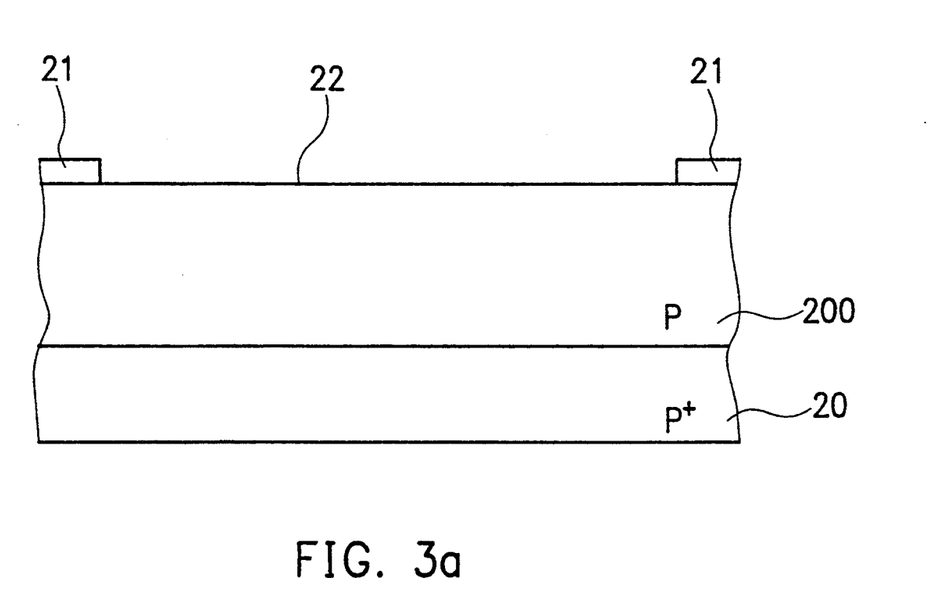
FIGS. 3a to 3g depict various steps in producing VDMOS transistors according to a second embodiment of the method of the present invention, the steps in FIGS. 3a–3g being for a P type substrate while the corresponding step depicted in FIG. 2a–2g are for an N type substrate.
Figure 3B:
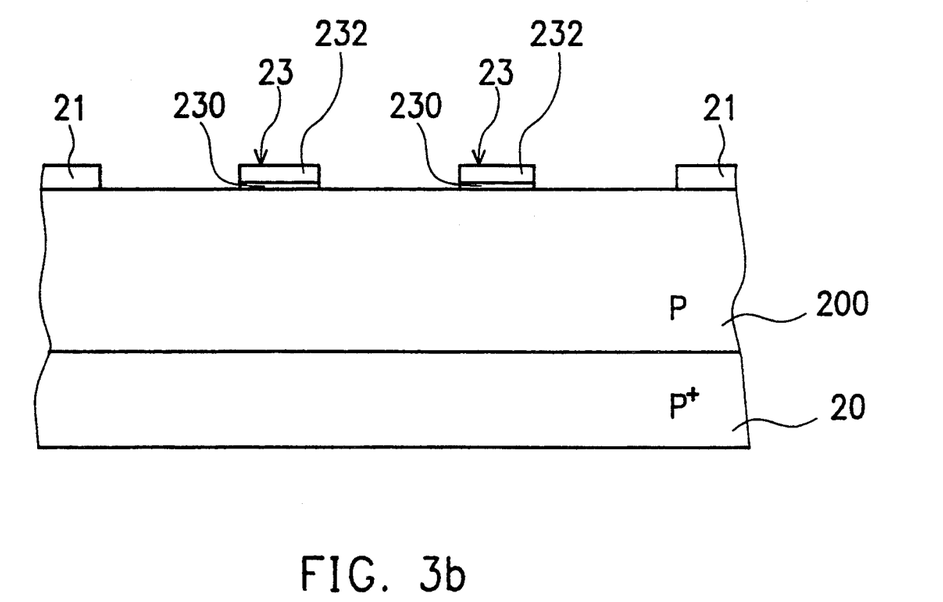
Figure 3C:
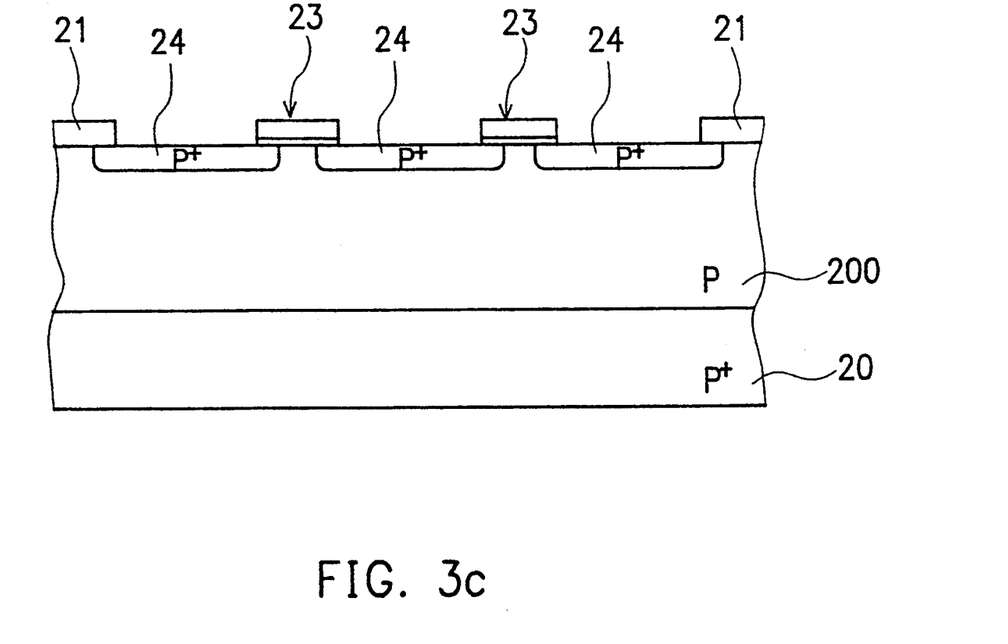
Figure 3D:
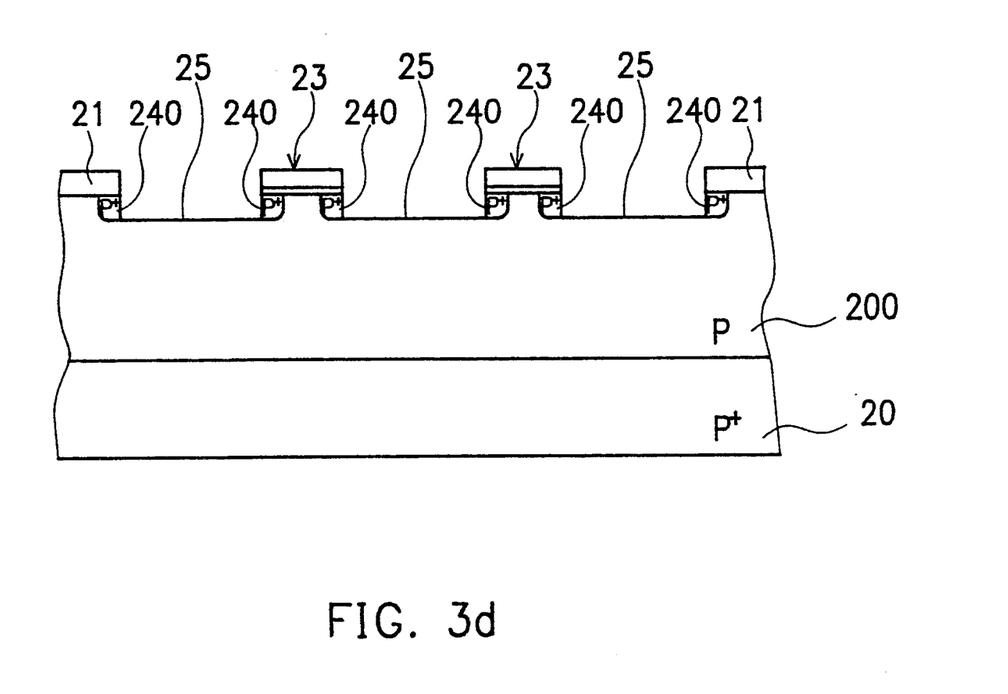
Figure 3E:
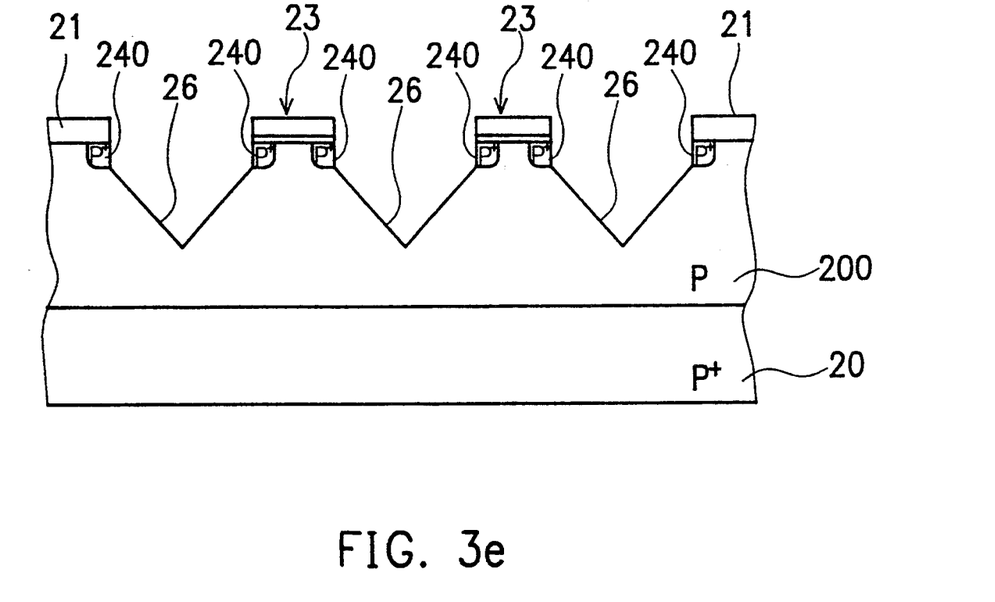
Figure 3F:
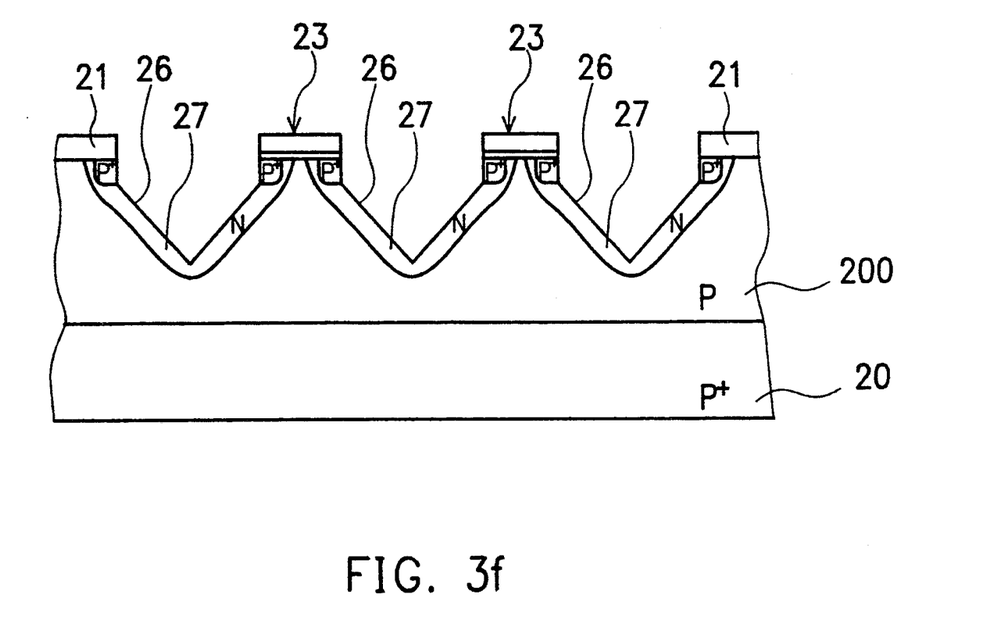
Figure 3G:
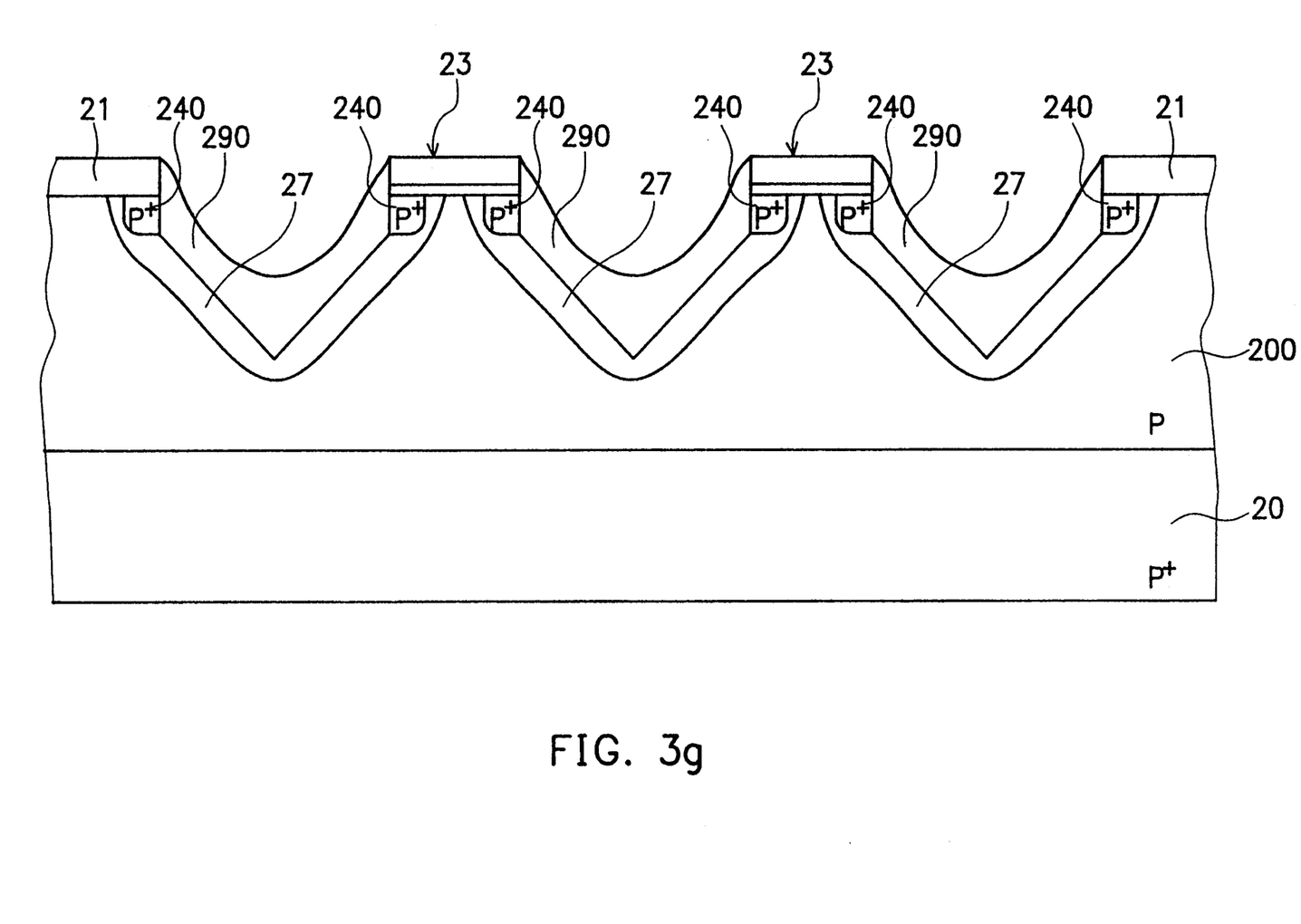

As shown in FIG. 2g, the substrate 20 is metalized to form metal contacts 290 by, for example, depositing a silicon dioxide layer (not shown) using chemical vapor deposition (CVD) techniques and a metal layer also by CVD techniques. The metal layer is then etched using conventional lithography techniques to define the metal contacts 290.

Since the first trenches are etched to reach the N type epitaxial layer 200, the vertically projected area of the residual portions of the N+ regions, i.e. the N+ source electrodes 240, is relatively small (i.e. smaller than the projected area in the prior art). The vertically projected area is the area which region 240 projects on a plane parallel to the major surface of the substrate 20. In the present invention, the leakage caused by the parasitic NPN transistor and the propensity of the transistors to latch-up are reduced compared to that of the prior art.

Another preferred embodiment of the present invention is shown in FIGS. 3a to 3g to form the VDMOS transistors on a P+ substrate having a P type epitaxial layer. Since the processes are essentially the same as in the above described embodiment and will be readily apparent to those skilled in the art, this embodiment need not be described in detail.

While the invention has been described by way of examples and in terms of two preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of forming VDMOS transistors on a substrate of a first conductivity type having a first conductivity type epitaxial layer, said substrate being a drain electrode of said VDMOS transistors, comprises the following steps:
    (a) forming field oxide on said first conductivity type epitaxial layer to define active regions of said VDMOS transistors;
    (b) forming gates of said VDMOS transistors at predetermined locations on the active regions;
    (c) implanting and diffusing impurities of the first conductivity type into said first conductivity type epitaxial layer to form first conductivity type regions;
    (d) forming first trenches in the first conductivity type regions to define residual portions of the first conductivity type regions adjacent said gates as source regions of said VDMOS transistors;
    (e) forming additional trenches in the first trenches, each of the second trenches having at least two planes;
    (f) implanting impurities of a second conductivity type into the second trenches to form second conductivity type regions, the second conductivity type regions enclosing the source regions; and
    (g) forming source contacts on said source regions.

2. A method of forming VDMOS transistors on a substrate of a first conductivity type as claimed in claim 1, wherein the first trenches are formed by reactive ion etching.

3. A method of forming VDMOS transistors on a substrate of a first conductivity type as claimed in claim 2, wherein the second trenches are formed by etching using a solution containing KOH.

4. A method of forming VDMOS transistors on a substrate of a first conductivity type as claimed in claim 3, wherein the first conductivity type is N type and the second conductivity type is P type.

5. A method of forming VDMOS transistors on a substrate of a first conductivity type as claimed in claim 3, wherein the first conductivity type is P type and the second conductivity type is N type.

6. A method of forming VDMOS transistors on a substrate of a first conductivity type as claimed in claim 4, wherein the second trenches are V-shaped.

7. A method of forming VDMOS transistors on a substrate of a first conductivity type as claimed in claim 5, wherein the second trenches are V-shaped.

* * * * *